(12) United States Patent
Wang et al.

(10) Patent No.: US 12,027,202 B2
(45) Date of Patent: Jul. 2, 2024

(54) SRAM STRUCTURES

(71) Applicant: Taiwan Semiconductor Manufacturing Co., Ltd., Hsinchu (TW)

(72) Inventors: Ping-Wei Wang, Hsin-Chu (TW); Chia-Hao Pao, Hsinchu (TW); Choh Fei Yeap, Hsinchu (TW); Yu-Kuan Lin, Taipei (TW); Kian-Long Lim, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 146 days.

(21) Appl. No.: 17/877,049

(22) Filed: Jul. 29, 2022

(65) Prior Publication Data

US 2022/0383943 A1    Dec. 1, 2022

Related U.S. Application Data

(63) Continuation of application No. 17/154,608, filed on Jan. 21, 2021, now Pat. No. 11,475,942.

(Continued)

(51) Int. Cl.
*G11C 11/41*     (2006.01)
*G11C 11/412*    (2006.01)
(Continued)

(52) U.S. Cl.
CPC .......... *G11C 11/412* (2013.01); *G11C 11/419* (2013.01); *H10B 10/12* (2023.02)

(58) Field of Classification Search
CPC ... G11C 11/412; G11C 11/419; G11C 11/418; G11C 8/08; G11C 7/12; G11C 11/41;
(Continued)

(56) References Cited

U.S. PATENT DOCUMENTS 9,640,540  B1    5/2017  Liaw
10,276,581 B1    4/2019  Liaw
(Continued)

FOREIGN PATENT DOCUMENTS

KR    20150051147 A    5/2015
KR    20150077545 A    7/2015
KR    20190085596 A    7/2019

OTHER PUBLICATIONS

Pao, Chia-Hao et al., "Memory System," U.S. Appl. No. 16/937,824, filed Jul. 24, 2020, Assignee: Taiwan Semiconductor Manufacturing Co., Ltd., 26 pages specification, 7 pages drawings.

*Primary Examiner* — Xiaochun L Chen
(74) *Attorney, Agent, or Firm* — Haynes and Boone, LLP

(57) ABSTRACT

Memory devices are provided. In an embodiment, a memory device includes a static random access memory (SRAM) array. The SRAM array includes a static random access memory (SRAM) array. The SRAM array includes a first subarray including a plurality of first SRAM cells and a second subarray including a plurality of second SRAM cells. Each n-type transistor in the plurality of first SRAM cells includes a first work function stack and each n-type transistor in the plurality of second SRAM cells includes a second work function stack different from the first work function stack.

20 Claims, 15 Drawing Sheets

Related U.S. Application Data

(60) Provisional application No. 63/040,825, filed on Jun. 18, 2020.

(51) Int. Cl.
*G11C 11/419* (2006.01)
*H10B 10/00* (2023.01)

(58) Field of Classification Search
CPC .... G11C 11/413; H10B 10/12; H10B 10/125; H10B 10/18; B82Y 10/00; H01L 27/0207; H01L 29/0673; H01L 29/42392; H01L 29/775; H01L 29/785; H01L 29/78696
See application file for complete search history.

(56) References Cited

U.S. PATENT DOCUMENTS

2010/0327372 A1* 12/2010 Goto ............... H01L 27/105
257/E27.099
2015/0041900 A1   2/2015 Weber

* cited by examiner

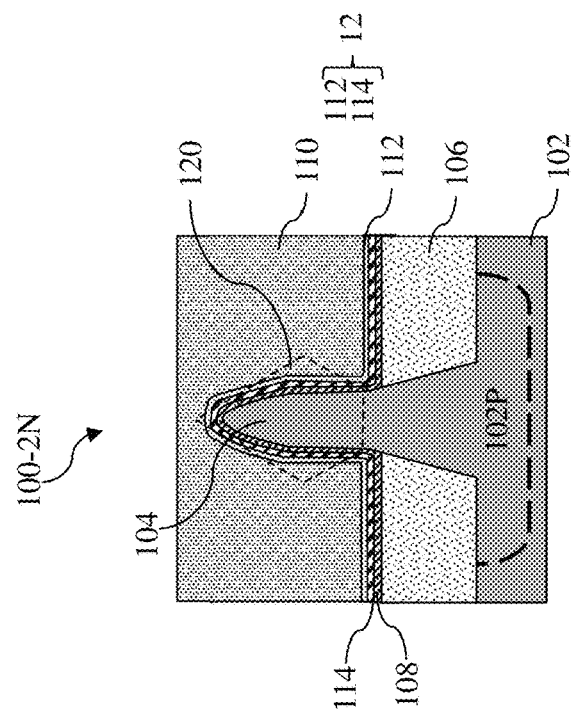
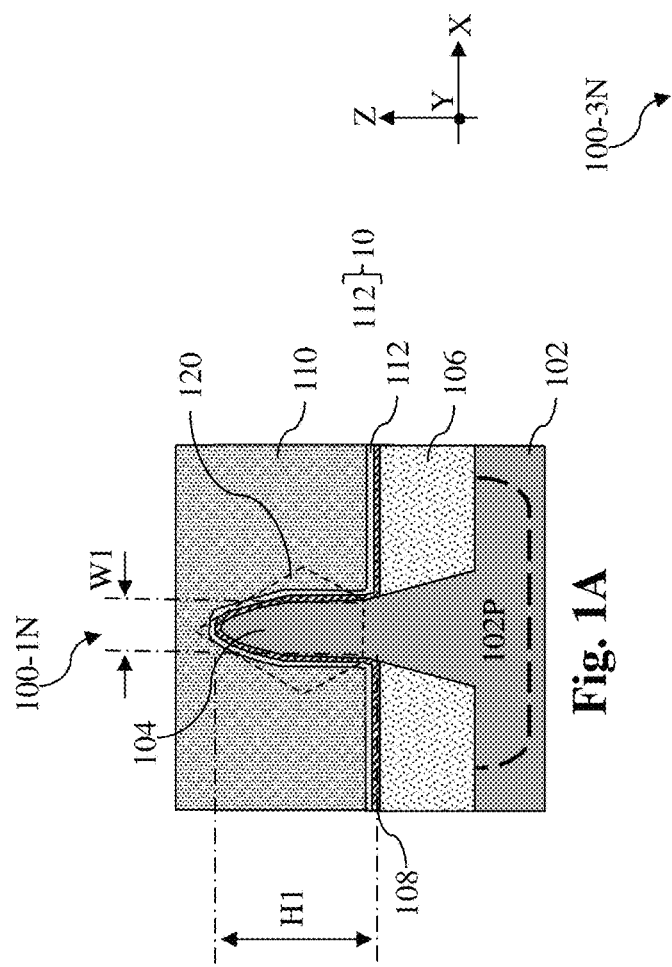
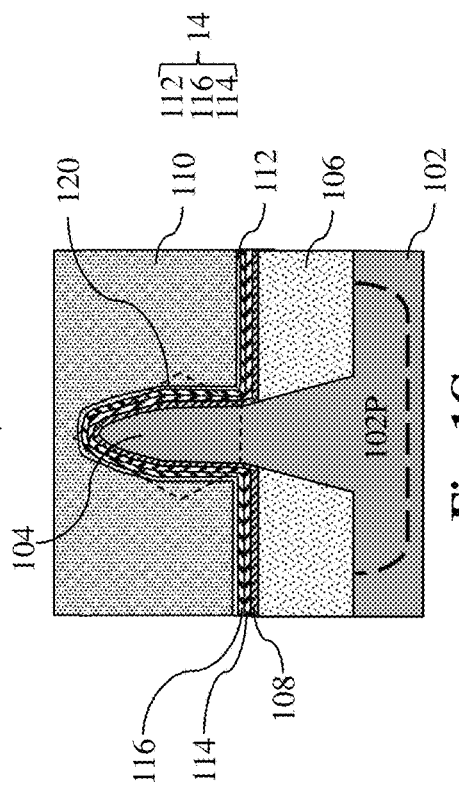
Fig. 1A
Fig. 1B
Fig. 1C

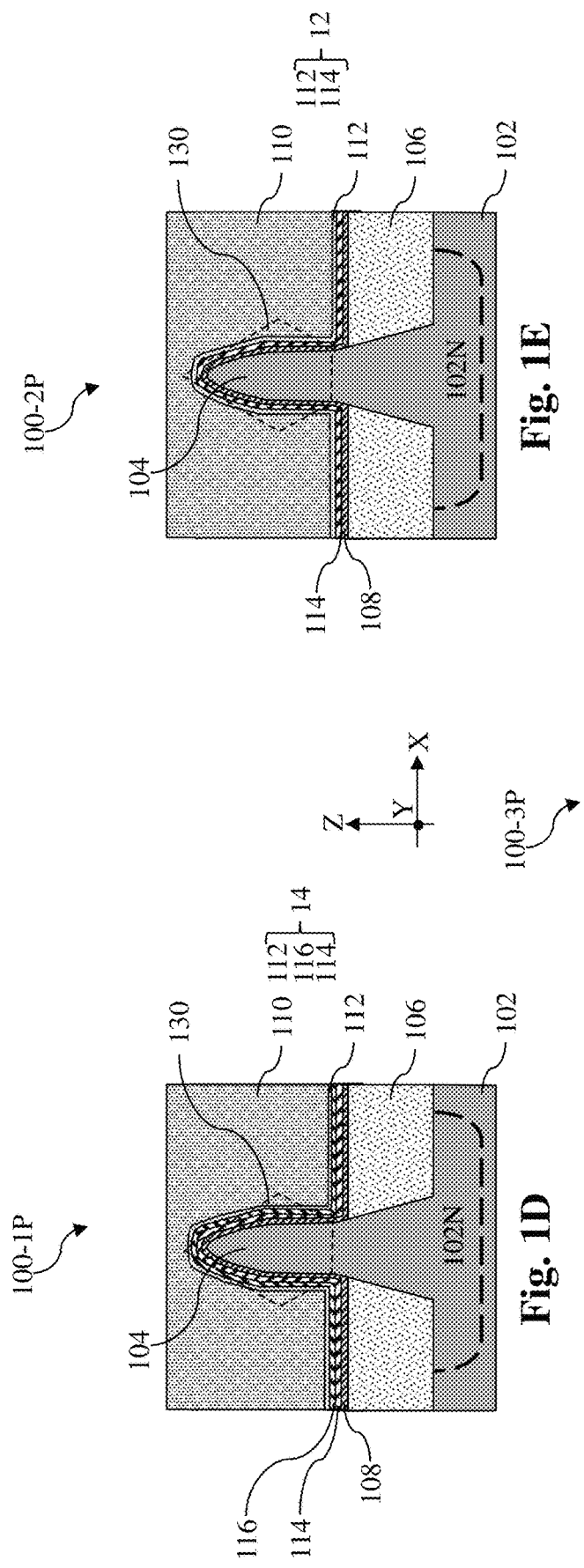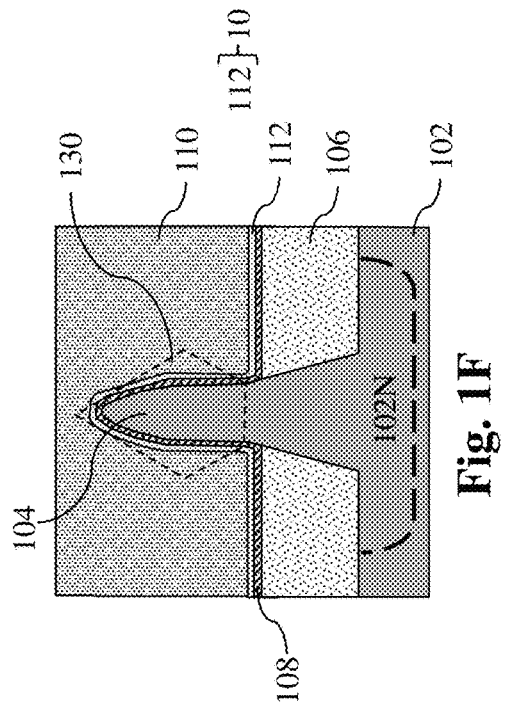
Fig. 1E
Fig. 1F
Fig. 1D

SRAM STRUCTURES

PRIORITY DATA

This application is a continuation of U.S. patent application Ser. No. 17/154,608, filed Jul. 15, 2022, which claims priority to U.S. Provisional Patent Application Ser. No. 63/040,825 filed on Jun. 18, 2020, each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, Static Random Access Memory (SRAM) has been widely used in IC circuits. An SRAM unit may be referred to as an SRAM cell that consists multiple transistors. SRAM cells are arranged in an SRAM array to serve as a memory device. With increasing degrees of product diversification, it is desirable that a memory device may balance speed and power consumption. With all transistors having similar structure and similar work function layer arrangement, it may be difficult to achieve such a balance. Therefore, while existing SRAM memory devices are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-1C illustrate n-type fin-type field effect transistors (FinFETs) having different work function stacks, according to aspects of the present disclosure.

FIGS. 1D-1F illustrate p-type FinFETs having different work function stacks, according to aspects of the present disclosure.

DETAILED DESCRIPTION

Figures 2A, 2B, 2C:
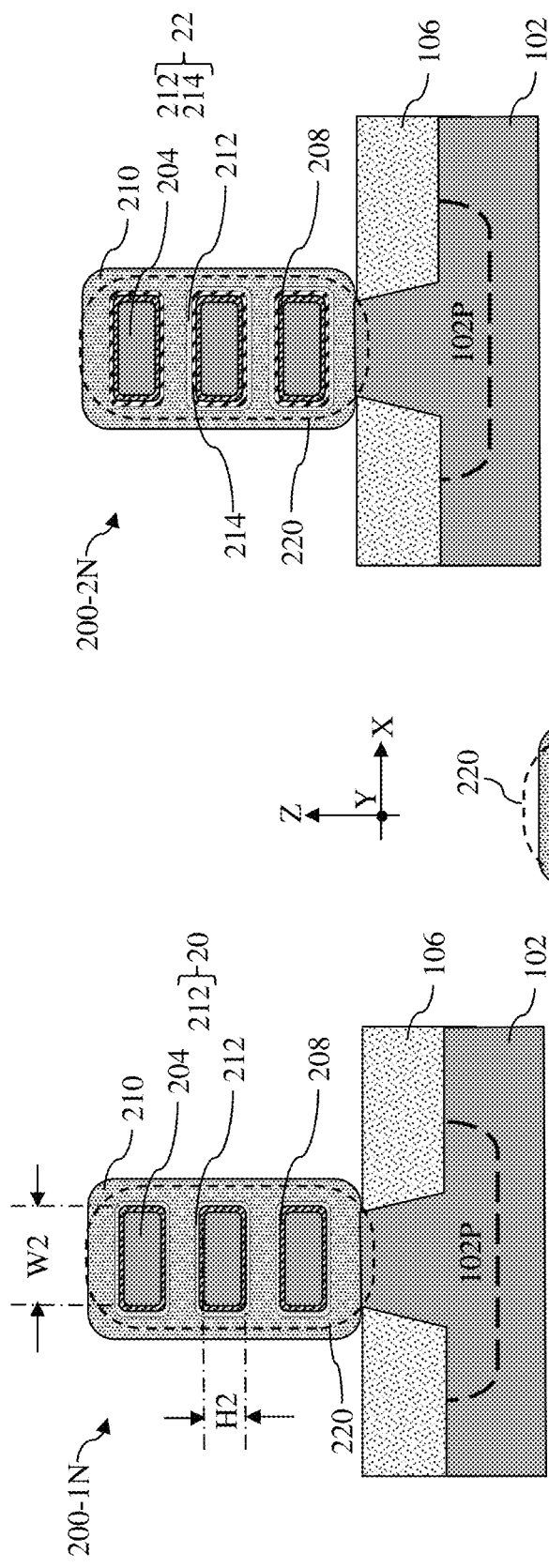
FIGS. 2A-2C illustrate n-type multi-bridge-channel (MBC) transistors having different work function stacks, according to aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

An SRAM array of a memory device may be implemented with multi-gate transistors, such as fin-type field effect transistors (FinFETs) or all be multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, or other nanostructures and for that reasons, an MBC transistor may also be referred to as a nanowire transistor or a nanosheet transistor. Further, to ensure process consistency and to avoid loading effect, it is desirable that all transistors in an SRAM array have similar dimensions. In some conventional designs, transistors in an SRAM array have the same work function layer arrangements and as a result, transistors in the SRAM array have the same threshold voltages.

As SRAM cells are shrinking in dimensions, design efforts are focused on a reaching a delicate balance between speed and power consumption. Such a balance requires having transistors of different threshold voltages in a single SRAM array. The present disclosure provides an SRAM array that include at least two subarrays. Each of the subarrays are formed of transistors having similar dimensions but different work function stacks to meet design needs in terms of speed and low consumption (i.e., low leakage).

Reference is made to FIGS. 1A-1F. The present disclosure provides a modularized work function arrangement for FinFETs. FIG. 1A illustrates a fragmentary cross-sectional view of a high-speed n-type FinFET 100-1N; FIG. 1B illustrates a fragmentary cross-sectional view of a standard n-type FinFET 100-2N; FIG. 1C illustrates a fragmentary cross-sectional view of a low-leakage n-type FinFET 100-3N; FIG. 1D illustrates a fragmentary cross-sectional view of a high-speed p-type FinFET 100-1P; FIG. 1E illustrates a fragmentary cross-sectional view of a standard p-type FinFET 100-2P; and FIG. 1F illustrates a fragmentary cross-sectional view of a low-leakage p-type FinFET 100-3P. Among the n-type FinFETs, the low-leakage n-type FinFET 100-3N has the highest threshold voltage, the high-speed n-type FinFET 100-1N has the lowest threshold voltage, and the standard n-type FinFET 100-2N has a threshold voltage that falls in the middle. Similarly, among the p-type FinFETs, the low-leakage p-type FinFET 100-3P has the highest threshold voltage, the high-speed p-type FinFET 100-1P has the lowest threshold voltage, and the standard p-type FinFET 100-2P has a threshold voltage that falls in the middle.

The FinFETs shown in FIGS. 1A-1F share some similar structures. For example, each of FinFETs shown in FIGS. 1A-1F includes a fin structure 104 formed from a substrate 102. A base portion of the fin structure 104 is buried in an isolation structure 106. A top portion of the fin structure 104 rises above the isolation structure 106. A gate dielectric layer 108 is disposed on the isolation structure 106 and surfaces of the top portion of the fin structure 104. A metal fill layer 110 wraps over the top portion of the fin structure 104. The top portion of the fin structure 104 has a first height H1 along the Z direction and a first width W1 along the X direction. All top portions of the FinFETs in FIGS. 1A-1F share the same dimensions.

The substrate 102 may be a silicon (Si) substrate. The substrate 102 may also include an insulating layer, such as a silicon oxide layer, to have a silicon-on-insulator (SOI) structure. Depending on the conductivity of the FinFETs, the substrate 102 may have different doped well regions. In cases of the high-speed n-type FinFET 100-1N, the standard n-type FinFET 100-2N and the low-leakage n-type FinFET 100-3N, the substrate 102 may include a p-type well region 102P (or p-well 102P) below the fin structure 104, as shown in FIGS. 1A-1C. In cases of the high-speed p-type FinFET 100-1P, the standard p-type FinFET 100-2P and the low-leakage p-type FinFET 100-3P, the substrate 102 may include an n-type well region 102N (or n-well 102N) below the fin structure 104, as shown in FIGS. 1D-1F. The n-type well region 102N may include a doping profile of an n-type dopant, such as phosphorus (P) or arsenic (As). The p-type well region 102P may include a doping profile of a p-type dopant, such as boron (B). The doping in the n-type well region 102N and the p-type well region 102P may be formed using ion implantation or thermal diffusion and may be considered portions of the substrate 102. The fin structure 104 shown in FIGS. 1A-1F is formed from the substrate 102 using a combination of photolithography processes and etching processes and shares the same composition with the substrate 102. The isolation structure 106 may include silicon oxide, silicon oxynitride, fluorine-doped silicate glass (FSG), a low-k dielectric, combinations thereof, and/or other suitable materials.

The gate dielectric layer 108 may include an interfacial layer and a high-k dielectric layer. As used and described herein, a high-k dielectric layer is formed of dielectric materials having a high dielectric constant, for example, greater than that of thermal silicon oxide (~3.9). The interfacial layer may include silicon oxide or hafnium silicate. In some embodiments, the high-k dielectric layer may include hafnium oxide. In some alternative embodiments, the high-k dielectric layer may include titanium oxide, hafnium zirconium oxide, tantalum oxide, hafnium silicon oxide, zirconium oxide, zirconium silicon oxide, lanthanum oxide, aluminum oxide, zirconium oxide, yttrium oxide, strontium titanate, barium titanate, barium zirconate, hafnium lanthanum oxide, lanthanum silicon oxide, aluminum silicon oxide, hafnium tantalum oxide, hafnium titanium oxide, barium strontium titanate (BST), silicon nitride, silicon oxynitride, combinations thereof, or other suitable material. The metal fill layer 110 may include aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof.

Besides the type of well regions, n-type FinFETs in FIGS. 1A-1C may also be different from p-type FinFETs in FIGS. 1D-1F in terms of source/drain features. Each of the n-type FinFETs in FIGS. 1A-1C includes n-type source/drain features 120 and each of the p-type FinFETs in FIGS. 1D-1F includes p-type source/drain features 130. In some embodiments, the n-type source/drain features 120 include epitaxially grown silicon doped with an n-type dopant, such as arsenic (As) or phosphorus (P) and the p-type source/drain features 130 includes epitaxial grown silicon germanium doped with a p-type dopant, such as boron (B) or gallium (Ga). The doping of the n-type source/drain features 120 and the p-type source/drain feature 130 may be performed in situ with the epitaxial deposition thereof or ex situ with implantation. In some embodiments, each of the n-type source/drain features 120 and the p-type source/drain features 130 may include more than one layers with different doping concentrations. It is noted that the n-type source/drain features 120 and the p-type source/drain features 130 are disposed over source/drain regions that are out of plane with the channel regions shown in FIGS. 1A-1F. For that reasons, the n-type source/drain features 120 and the p-type source/drain features 130 are shown in dotted lines in FIGS. 1A-1F. The fin structure 104 in the channel region is sandwiched between two n-type source/drain features 120 for n-type FinFETs shown in FIGS. 1A-1C or two p-type source/drain features 130 for p-type FinFETs shown in FIGS. 1D-1F.

The n-type FinFETs shown in FIGS. 1A-1C have different work function stacks. The high-speed n-type FinFET 100-1N includes a first work function stack 10, the standard n-type FinFET 100-2N includes a second work function stack 12, and the low-leakage n-type FinFET 100-3N includes a third work function stack 14. The first work function stack 10, the second work function stack 12, and the third work function stack 14 are different from one another and each is disposed between the gate dielectric layer 108 and the metal fill layer 110. The first work function stack 10 includes an n-type work function layer 112. In some embodiments, the n-type work function layer 112 may include titanium aluminum (TiAl) and may have a thickness between about 20 Å and about 30 Å. The second work function stack 12 includes a first p-type work function layer 114 and the n-type work function layer 112 over the first p-type work function layer 114. In some embodiments, the first p-type work function layer 114 may include titanium nitride (TiN) and may have a thickness between about 5 Å and about 15 Å. The third work function stack 14 includes the first p-type work function layer 114, a second p-type work function layer 116 disposed over the first p-type work function layer 114, and the n-type work function layer 112 over the second p-type work function layer 116. In some embodiments, the second p-type work function layer 116 may include titanium nitride (TiN) and may have a thickness between about 5 Å and about 15 Å. The total thickness of the third work function stack 14 is greater than that of the second work function stack 12. The total thickness of the second work function stack 12 is greater than that of the first work function stack 10.

Among the first, second and third work function stacks 10, 12 and 14, the n-type work function layer 112 is closest to the fin structure 104 in the first work function stack 10 and is farthest from the fin structure 104 in the third work function stack 14. As a result, a threshold voltage of the low-leakage n-type FinFET 100-3N is greater than a threshold voltage of the standard n-type FinFET 100-2N and the threshold voltage of the standard n-type FinFET 100-2N is greater than a threshold voltage of the high-speed n-type FinFET 100-1N. The relative low threshold voltage of the high-speed n-type FinFET 100-1N allows it to have increased speed and drive current, hence its name. The relative high threshold voltage of the low-leakage n-type FinFET 100-3N allows it to have reduced leakage and consumption, hence its name. The standard n-type FinFET 100-2N has a threshold voltage that falls in the middle and is referred to as "standard."

The p-type FinFETs shown in FIGS. 1D-1F have different work function stacks as well. The high-speed p-type FinFET 100-1P includes third work function stack 14, the standard p-type FinFET 100-2P includes the second work function stack 12, and the low-leakage p-type FinFET 100-3P includes the first work function stack 10. Among the first, second and third work function stacks 10, 12 and 14, the n-type work function layer 112 is closest to the fin structure 104 in the first work function stack 10 and is farthest from the fin structure 104 in the third work function stack 14. As a result, a threshold voltage of the low-leakage p-type FinFET 100-3P is greater than a threshold voltage of the standard p-type FinFET 100-2P and the threshold voltage of the standard p-type FinFET 100-2P is greater than a threshold voltage of the high-speed p-type FinFET 100-1P. The relative low threshold voltage of the high-speed p-type FinFET 100-1P allows it to have increased speed and drive current, hence its name. The relative high threshold voltage of the low-leakage p-type FinFET 100-3P allows it to have reduced leakage and consumption, hence its name. The standard p-type FinFET 100-2P has a threshold voltage that falls in the middle and is referred to as "standard."

It is noted that due to the change of conductivity types, the high-speed n-type FinFET 100-1N and the low-leakage p-type FinFET 100-3P share the same first work function stack 10, the standard n-type FinFET 100-2N and the standard p-type FinFET 100-2P share the same second work function stack 12, and the low-leakage n-type FinFET 100-3N and the high-speed p-type FinFET 100-1P share the same third work function stack 14.

Figure 2D:
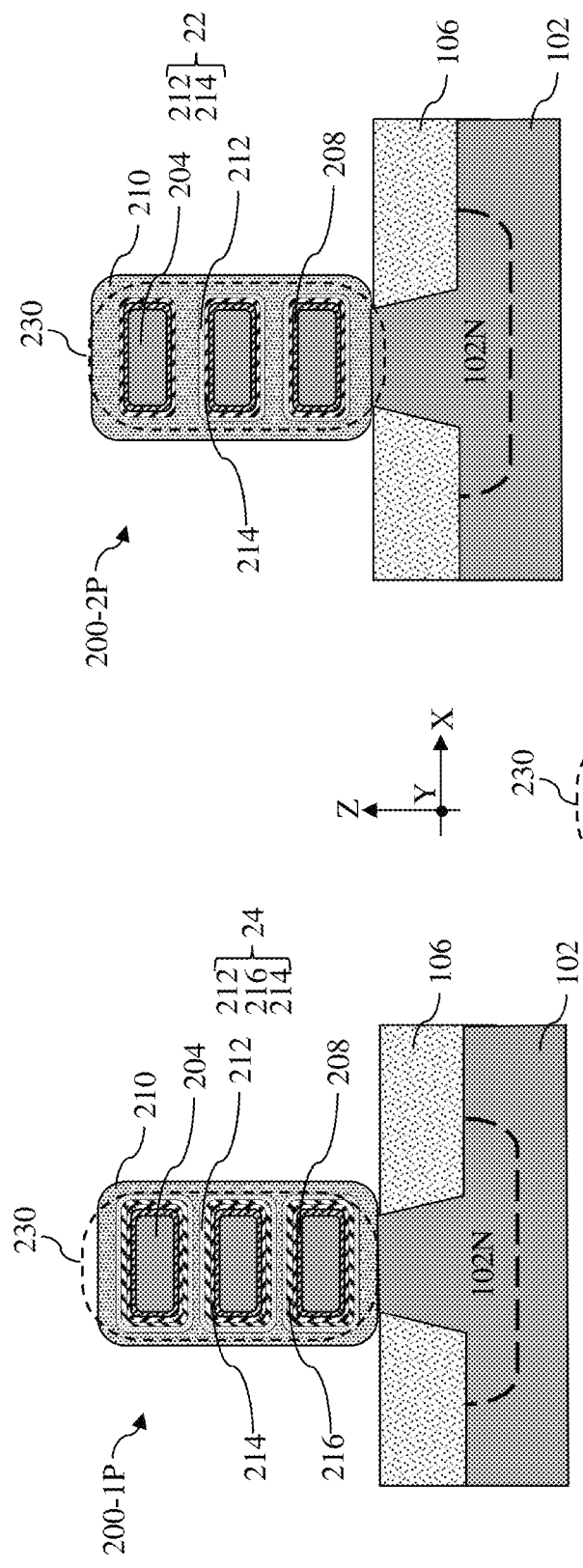
FIGS. 2D-2F illustrate p-type MBC transistors having different work function stacks, according to aspects of the present disclosure.
Figure 2E:
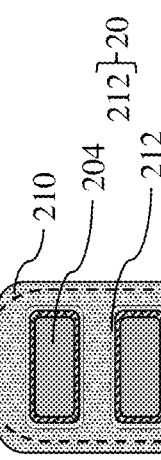
Figure 2F:
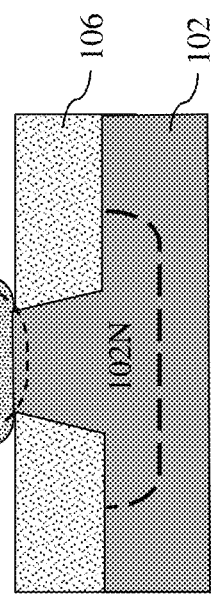

Reference is then made to FIGS. 2A-2F. The present disclosure also provides a modularized work function arrangement for MBC transistors. FIG. 2A illustrates a fragmentary cross-sectional view of a high-speed n-type MBC transistor 200-1N; FIG. 2B illustrates a fragmentary cross-sectional view of a standard n-type MBC transistor 200-2N; FIG. 2C illustrates a fragmentary cross-sectional view of a low-leakage n-type MBC transistor 200-3N; FIG. 2D illustrates a fragmentary cross-sectional view of a high-speed p-type MBC transistor 200-1P; FIG. 2E illustrates a fragmentary cross-sectional view of a standard p-type MBC transistor 200-2P; and FIG. 2F illustrates a fragmentary cross-sectional view of a low-leakage p-type MBC transistor 200-3P. Among the n-type MBC transistors, the low-leakage n-type MBC transistor 200-3N has the highest threshold voltage, the high-speed n-type MBC transistor 200-1N has the lowest threshold voltage, and the standard n-type MBC transistor 200-2N has a threshold voltage that falls in the middle. Similarly, among the p-type MBC transistors, the low-leakage p-type MBC transistor 200-3P has the highest threshold voltage, the high-speed p-type MBC transistor 200-1P has the lowest threshold voltage, and the standard p-type MBC transistor 200-2P has a threshold voltage that falls in the middle. It is noted that throughout this disclosure, like numbers are used to denote similar features and repeated descriptions may be omitted for brevity.

The MBC transistors shown in FIGS. 2A-2F share some similar structures. For example, each of MBC transistors shown in FIGS. 2A-2F includes a vertical stack of channel members 204 disposed over a substrate 102. A fin-shaped base portion below the channel members 204 is buried in an isolation structure 106. An MBC gate dielectric layer 208 is disposed around each of the channel members 204. An MBC metal fill layer 210 wraps over and around each of the channel members 204. Each of the channel members 204 has a second height H2 along the Z direction and a second width W2 along the X direction.

The substrate 102 may be a silicon (Si) substrate. The substrate 102 may also include an insulating layer, such as a silicon oxide layer, to have a silicon-on-insulator (SOI) structure. Depending on the conductivity of the MBC transistors, the substrate 102 may have different doped well regions. In cases of the high-speed n-type MBC transistor 200-1N, the standard n-type MBC transistor 200-2N and the low-leakage n-type MBC transistor 200-3N, the substrate 102 may include a p-type well region 102P (or p-well 102P) below the vertical stack of channel members 204, as shown in FIGS. 2A-2C. In cases of the high-speed p-type MBC transistor 200-1P, the standard p-type MBC transistor 200-2P and the low-leakage p-type MBC transistor 200-3P, the substrate 102 may include an n-type well region 102N (or n-well 102N) below the vertical stack of channel members 204, as shown in FIGS. 2D-2F. The n-type well region 102N may include a doping profile of an n-type dopant, such as phosphorus (P) or arsenic (As). The p-type well region 102P may include a doping profile of a p-type dopant, such as boron (B). The doping in the n-type well region 102N and the p-type well region 102P may be formed using ion implantation or thermal diffusion and may be considered portions of the substrate 102. The vertical stack of channel members 204 shown in FIGS. 2A-2F is formed from an epitaxial stack deposited on the substrate 102 using a combination of photolithography processes and etching processes. In an example implementation, the epitaxial stack may include a plurality of silicon layers interleaved by a plurality of silicon germanium layers. After the epitaxial stack is formed into a fin-shaped structure, a subsequent process may selectively remove the silicon germanium layer to release the silicon layers as channel members. In this example implementation, the channel members 204 include silicon. The isolation structure 106 may include silicon oxide, silicon oxynitride, fluorine-doped silicate glass (FSG), a low-k dielectric, combinations thereof, and/or other suitable materials.

The MBC gate dielectric layer 208 may include an interfacial layer and a high-k dielectric layer. As used and described herein, a high-k dielectric layer is formed of dielectric materials having a high dielectric constant, for example, greater than that of thermal silicon oxide (~3.9). The interfacial layer may include silicon oxide or hafnium silicate. In some embodiments, the high-k dielectric layer may include hafnium oxide. In some alternative embodiments, the high-k dielectric layer may include titanium oxide, hafnium zirconium oxide, tantalum oxide, hafnium silicon oxide, zirconium oxide, zirconium silicon oxide, lanthanum oxide, aluminum oxide, zirconium oxide, yttrium oxide, strontium titanate, barium titanate, barium zirconate, hafnium lanthanum oxide, lanthanum silicon oxide, aluminum silicon oxide, hafnium tantalum oxide, hafnium titanium oxide, barium strontium titanate (BST), silicon nitride, silicon oxynitride, combinations thereof, or other suitable material. As shown in FIGS. 2A-2F, the MBC gate dielectric layer 208 wraps around each of the channel members 204 and interfaces each of the channel members 204 by the interfacial layer. The MBC metal fill layer 210 may include aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. The MBC metal fill layer 210 also wraps around each of the channel members 204.

Besides the type of well regions, n-type MBC transistors in FIGS. 2A-2C may also be different from p-type MBC transistor in FIGS. 2D-2F in terms of source/drain features. Each of the n-type MBC transistors in FIGS. 2A-2C includes n-type MBC source/drain features 220 and each of the p-type MBC transistors in FIGS. 2D-2F includes p-type MBC source/drain features 230. In some embodiments, the n-type MBC source/drain features 220 include epitaxially grown silicon doped with an n-type dopant, such as arsenic (As) or phosphorus (P) and the p-type MBC source/drain features 230 includes epitaxial grown silicon germanium doped with a p-type dopant, such as boron (B) or gallium (Ga). The doping of the n-type MBC source/drain features 220 and the p-type MBC source/drain feature 230 may be performed in situ with the epitaxial deposition thereof or ex situ with implantation. In some embodiments, each of the n-type MBC source/drain features 220 and the p-type MBC source/drain features 230 may include more than one layers with different doping concentrations. It is noted that the n-type MBC source/drain features 220 and the p-type MBC source/drain features 230 are epitaxially grown from sidewalls of the channel members and exposed surfaces of the substrate 102 over source/drain regions that are out of plane with the channel regions shown in FIGS. 2A-2F. For that reasons, the n-type MBC source/drain features 220 and the p-type MBC source/drain features 230 are shown in dotted lines in FIGS. 2A-2F. The vertical stack of channel members 204 in the channel region is sandwiched between two n-type MBC source/drain features 220 for n-type MBC transistors shown in FIGS. 2A-2C or two p-type MBC source/drain features 230 for p-type MBC transistors shown in FIGS. 2D-2F.

The n-type MBC transistors shown in FIGS. 2A-2C have different work function stacks. The high-speed n-type MBC transistor 200-1N includes a first MBC work function stack 20, the standard n-type MBC transistor 200-2N includes a second MBC work function stack 22, and the low-leakage n-type MBC transistor 200-3N includes a third MBC work function stack 24. The first MBC work function stack 20, the second MBC work function stack 22, and the third MBC work function stack 24 are different from one another and each is disposed between the MBC gate dielectric layer 208 and the MBC metal fill layer 210. The first MBC work function stack 20 includes an n-type MBC work function layer 212 that wraps over and around the channel members 204. In some embodiments, the n-type MBC work function layer 212 may include titanium aluminum (TiAl) and may have a thickness between about 15 Å and about 20 Å. The second MBC work function stack 22 includes a first p-type MBC work function layer 214 and the n-type MBC work function layer 212 over the first p-type MBC work function layer 214. In some embodiments, the first p-type MBC work function layer 214 may include titanium nitride (TiN) and may have a thickness between about 1 Å and about 5 Å. The third MBC work function stack 24 includes the first p-type MBC work function layer 214, a second p-type MBC work function layer 216 disposed over the first p-type MBC work function layer 214, and the n-type MBC work function layer 212 over the second p-type MBC work function layer 216. In some embodiments, the second p-type MBC work function layer 216 may include titanium nitride (TiN) and may have a thickness between about 1 Å and about 5 Å. Different from the first work function stack 10, the second work function stack 12 and the third work function stack 14, the first MBC work function stack 20, the second MBC work function stack 22, and the third MBC work function stack 24 wrap around each of the channel members 204. Additionally, due to the restraint of space between channel members 204, it is noted that the n-type MBC work function layer 212, the first p-type MBC work function layer 214 and the second p-type MBC work function layer 216 are thinner than their respective counterpart. The total thickness of the third MBC work function stack 24 is greater than that of the second MBC work function stack 22. The total thickness of the second MBC work function stack 22 is greater than that of the first MBC work function stack 20.

Among the first, second and third MBC work function stacks 20, 22 and 24, the n-type MBC work function layer 212 is closest to the channel members 204 in the first MBC work function stack 20 and is farthest from the channel members 204 in the third MBC work function stack 24. As a result, a threshold voltage of the low-leakage n-type MBC transistor 200-3N is greater than a threshold voltage of the standard n-type MBC transistor 200-2N and the threshold voltage of the standard n-type MBC transistor 200-2N is greater than a threshold voltage of the high-speed n-type MBC transistor 200-1N. The relative low threshold voltage of the high-speed n-type MBC transistor 200-1N allows it to have increased speed and drive current, hence its name. The relative high threshold voltage of the low-leakage n-type MBC transistor 200-3N allows it to have reduced leakage and consumption, hence its name. The standard n-type MBC transistor 200-2N has a threshold voltage that falls in the middle and is referred to as "standard."

The p-type MBC transistors shown in FIGS. 2D-2F have different work function stacks as well. The high-speed p-type MBC transistor 200-1P includes the third MBC work function stack 24, the standard p-type MBC transistor 200-2P includes the second MBC work function stack 22, and the low-leakage p-type MBC transistor 200-3P includes the first MBC work function stack 20. Among the first, second and third MBC work function stacks 20, 22 and 24, the n-type MBC work function layer 212 is closest to the channel members 204 in the first MBC work function stack 20 and is farthest from the channel members 204 in the third MBC work function stack 24. As a result, a threshold voltage of the low-leakage p-type MBC transistor 200-3P is greater than a threshold voltage of the standard p-type MBC transistor 300-2P and the threshold voltage of the standard p-type MBC transistor 200-2P is greater than a threshold voltage of the high-speed p-type MBC transistor 200-1P. The relative low threshold voltage of the high-speed p-type MBC transistor 200-1P allows it to have increased speed and drive current, hence its name. The relative high threshold voltage of the low-leakage p-type MBC transistor 300-3P allows it to have reduced leakage and consumption, hence its name. The standard p-type MBC transistor 200-2P has a threshold voltage that falls in the middle and is referred to as "standard."

It is noted that due to the change of conductivity types, the high-speed n-type MBC transistor 200-1N and the low-leakage p-type MBC transistor 200-3P share the same first MBC work function stack 20, the standard n-type MBC transistor 200-2N and the standard p-type MBC transistor 200-2P share the same second MBC work function stack 22, and the low-leakage n-type MBC transistor 200-3N and the high-speed p-type MBC transistor 200-1P share the same third MBC work function stack 24.

Figure 3:
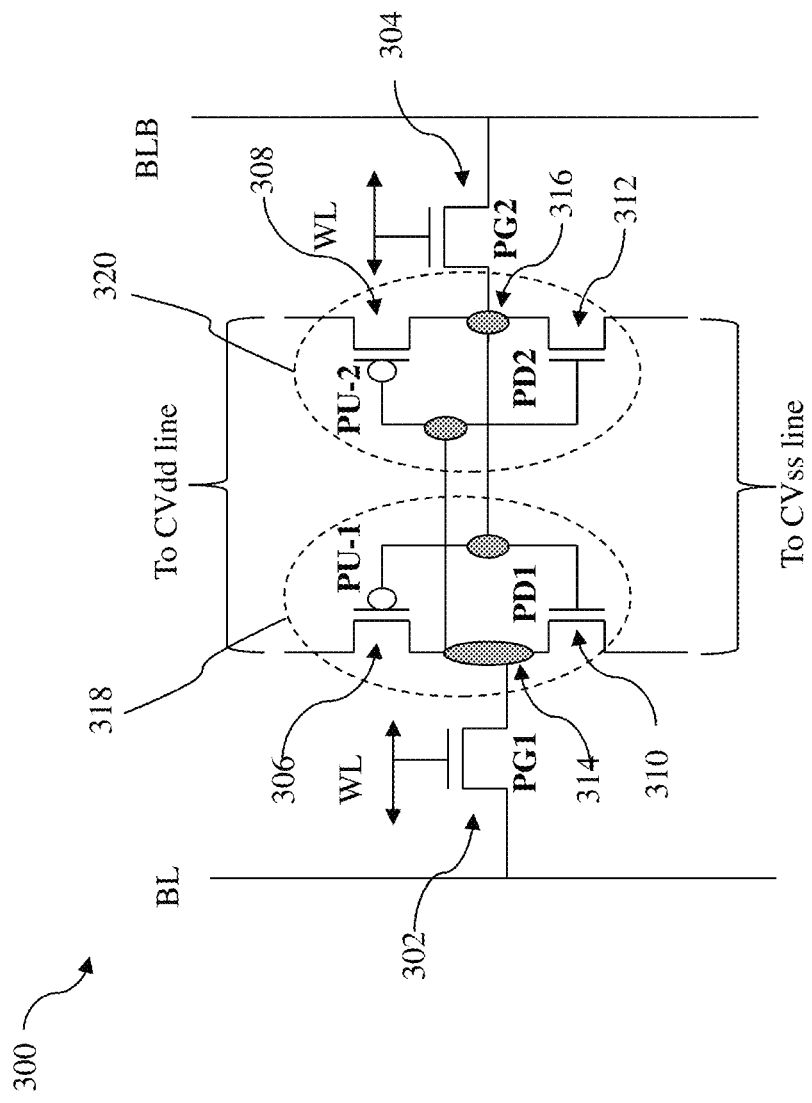
FIG. 3 illustrates a circuit diagram of an SRAM cell, according to one or more aspects of the present disclosure.

According to the present disclosure, The FinFETs shown in FIGS. 1A-1F and MBC transistors shown in FIGS. 2A-2F may be implemented in a Static Random Access Memory (SRAM) cell that includes a plurality of transistors, such as 6, 7, 8, 9, 10, 11, or 12 transistors. As an example, a circuit diagram of a 6-transistor (6T) SRAM cell 300 is illustrated in FIG. 3. The SRAM cell 300 includes first and second pass-gate transistors (PG1) 302 and (PG2) 304, first and second pull-up transistors (PU1) 306 and (PU2) 308, and first and second pull-down transistors (PD1) 310 and (PD2) 312. The gates of the first pass-gate transistor (PG1) 302 and second pass-gate transistors (PG2) 304 are electrically coupled to a word line (WL) that determines whether the SRAM cell 300 is selected/activated or not. In the SRAM cell 300, a memory bit (e.g., a latch or a flip-flop) is formed of the first pull-up transistor (PU1) 306, the second pull-up transistor (PU2) 308, the first pull-down transistor (PD1) 310, and the second pull-down transistor (PD2) 312 to store a bit of data. The complementary values of the bit are stored in a first storage node 314 and a second storage node 316. The stored bit can be written into, or read from, the SRAM cell 300 through Bit-line (BL) and Bit-Line Bar (BLB). In this arrangement, the BL and BLB may carry complementary bit-line signals. The SRAM cell 300 is powered through a voltage bus that has a positive power supply voltage (Vdd) and is also connected to a ground potential bus at ground potential (Vss).

The SRAM cell 300 includes a first inverter 318 formed of the first pull-up (PU1) transistor 306 and the first pull-down transistor (PD1) 310 as well as a second inverter 320 formed of the second pull-up transistor (PU2) 308 and the second pull-down transistor (PD2) 312. The first inverter 318 and the second inverter 320 are coupled between the positive power supply voltage (Vdd) and the ground potential (Vss). As shown in FIG. 3, the first inverter 318 and the second inverter 320 are cross-coupled. That is, the first inverter 318 has an input coupled to the output of the second inverter 320. Likewise, the second inverter 320 has an input coupled to the output of the first inverter 318. The output of the first inverter 318 is the first storage node 314. Likewise, the output of the second inverter 320 is the second storage node 316. In a normal operating mode, the first storage node 314 is in the opposite logic state as the second storage node 316. By employing the two cross-coupled inverters, the SRAM cell 300 can hold the data using a latched structure so that the stored data will not be lost without applying a refresh cycle as long as power is supplied through Vdd.

Figure 4:
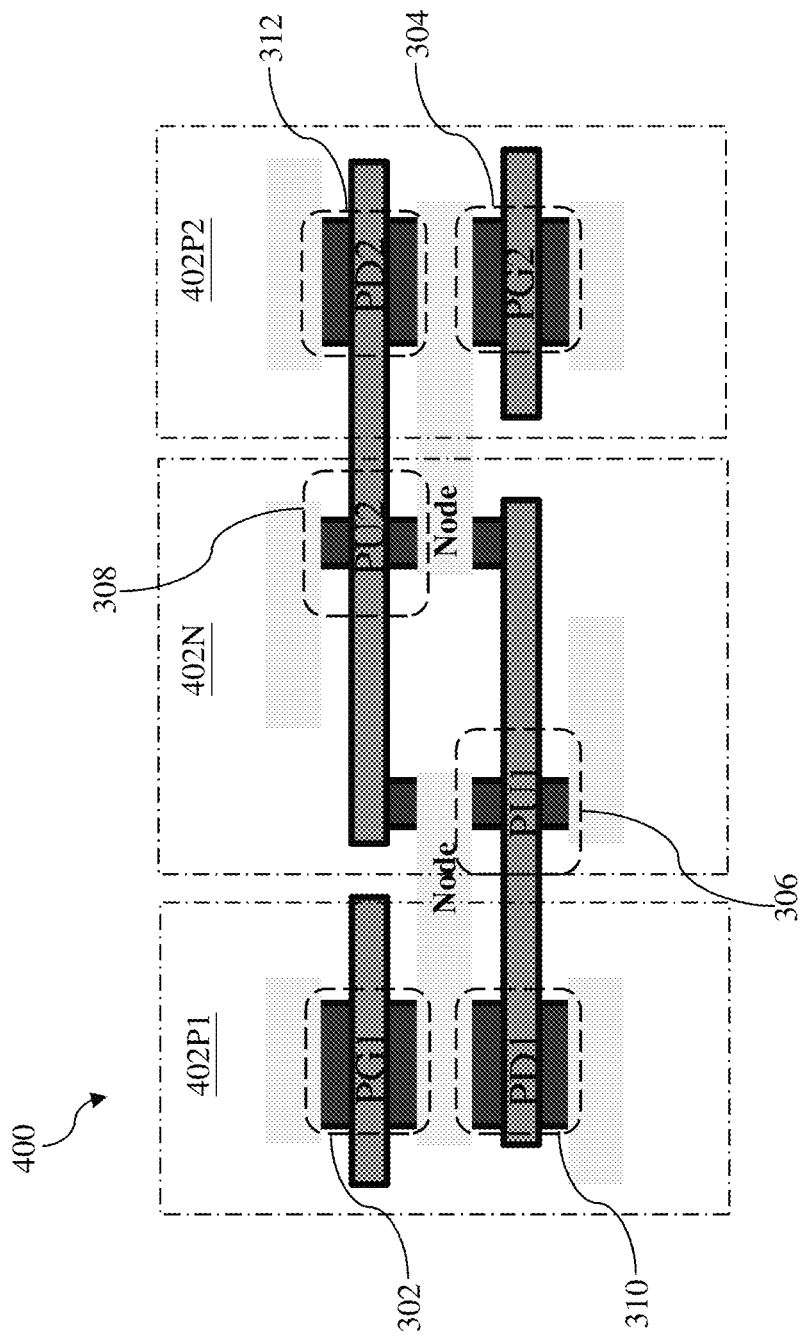
FIG. 4 illustrates an example layout of the SRAM cell in FIG. 3, according to one or more aspects of the present disclosure.

Referring to FIG. 4, the SRAM cell 300 may be implemented using a layout 400. In some embodiments, the first pull-up transistor (PU1) 306 and the second pull-up transistor (PU2) 308 are p-type transistors that formed in an n-well 402N; the first pull-down transistor (PD1) 310 and the first pass-gate transistor (PG1) 302 are n-type transistors that formed in a first p-well 402P1; and the second pull-down transistor (PD2) 312 and the second pass-gate transistor (PG2) 304 are n-type transistors that formed in a second p-well 402P2. The n-well 402N is disposed between the first p-well 402P1 and the second p-well 402P2.

Figure 5B:
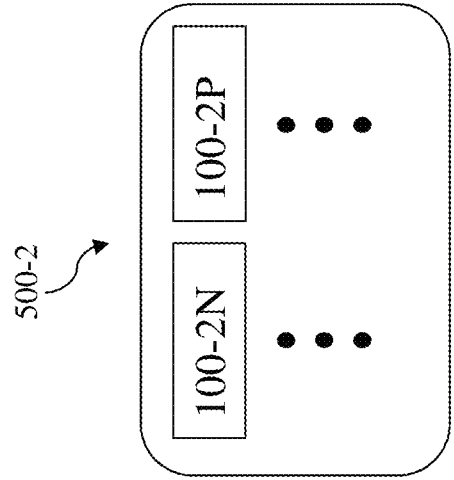
FIGS. 5A-5C illustrate embodiments of SRAM cells including n-type FinFETs in FIGS. 1A-1C and p-type FinFETs in FIGS. 1D-1F, according to one or more aspects of the present disclosure.
Figure 5C:
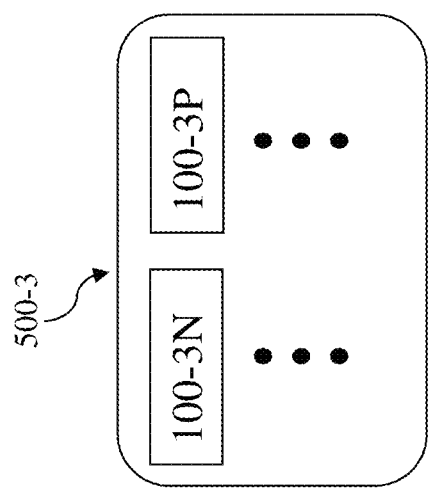
Figure 5A:
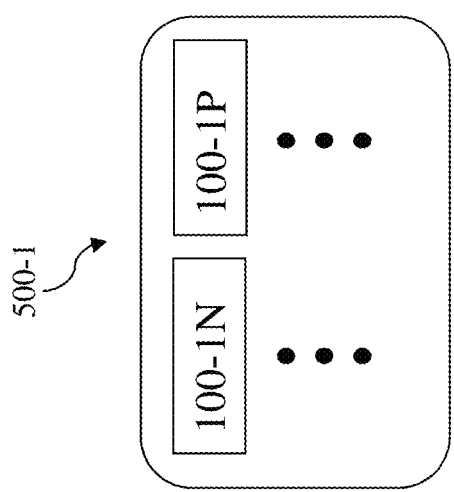

In some embodiments, the n-type transistors and p-type transistors in the layout 400 may be implemented using the n-type and p-type FinFETs shown in FIGS. 1A-1F. Referring to FIG. 5A, a high-speed FinFET SRAM cell 500-1 may include the high-speed p-type FinFETs 100-1P serving as the first and second pull-up transistors and the high-speed n-type FinFETs 100-1N serving as the first and second pull-down transistors and the first and second pass-gate transistors. Referring to FIG. 5B, a standard FinFET SRAM cell 500-2 may include the standard p-type FinFETs 100-2P serving as the first and second pull-up transistors and the standard n-type FinFETs 100-2N serving as the first and second pull-down transistors and the first and second pass-gate transistors. Referring to FIG. 5C, a low-leakage FinFET SRAM cell 500-3 may include the low-leakage p-type FinFETs 100-3P serving as the first and second pull-up transistors and the low-leakage n-type FinFETs 100-3N serving as the first and second pull-down transistors and the first and second pass-gate transistors.

Figure 6B:
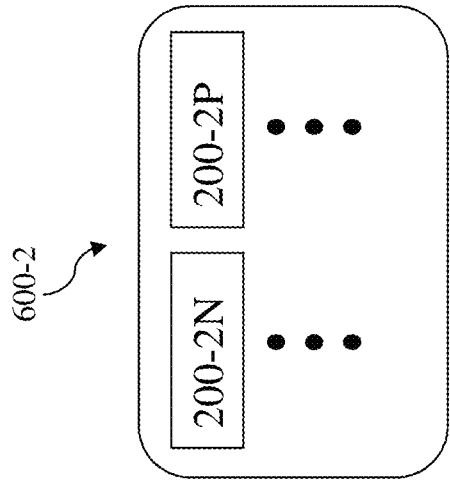
FIGS. 6A-6C illustrate embodiments of SRAM cells including n-type MBC transistors in FIGS. 2A-2C and p-type MBC transistors in FIGS. 2D-2F, according to one or more aspects of the present disclosure.
Figure 6C:
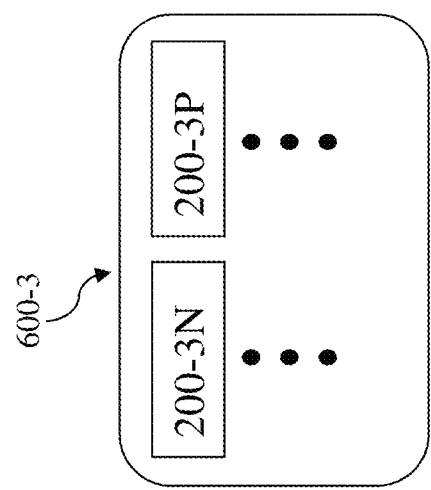
Figure 6A:
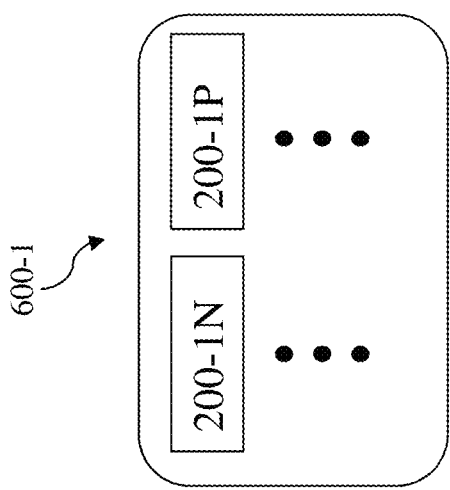

In some alternative embodiments, the n-type transistors and p-type transistors in the layout 400 may be implemented using the n-type and p-type MBC transistors shown in FIGS. 2A-2F. Referring to FIG. 6A, a high-speed MBC SRAM cell 600-1 may include the high-speed p-type MBC transistors 200-1P serving as the first and second pull-up transistors and the high-speed n-type MBC transistors 200-1N serving as the first and second pull-down transistors and the first and second pass-gate transistors. Referring to FIG. 6B, a standard MBC SRAM cell 600-2 may include the standard p-type MBC transistors 200-2P serving as the first and second pull-up transistors and the standard n-type MBC transistors 200-2N serving as the first and second pull-down transistors and the first and second pass-gate transistors. Referring to FIG. 6C, a low-leakage MBC SRAM cell 600-3 may include the low-leakage p-type MBC transistors 200-3P serving as the first and second pull-up transistors and the low-leakage n-type MBC transistors 200-3N serving as the first and second pull-down transistors and the first and second pass-gate transistors. The high-speed SRAM cells, the standard SRAM cells, and the low-leakage SRAM cells shown in FIGS. 5A-5C and 6A-6C may be selectively implemented in different portions of a memory device to achieve improved performance.

FIGS. 7, 8, 9, 10, 11, and 12 illustrate a first memory device 700, a second memory device 800, a third memory device 900, a fourth memory device 1000, a fifth memory device 1100, and a sixth memory device 1200, respectively. Each of these memory devices includes an SRAM array, a word line driver (WL DRV), a memory controller (MC-TRL), and a read/write block (R/W BLK). The SRAM array may include a plurality of SRAM cells arranged in rows that extend along the X direction and columns that extend along the Y direction. In some implementations, the SRAM array may be rectangular in shape. As similarly described above with respect to the SRAM cell 300 in FIG. 3, each of the SRAM cells in the SRAM array is coupled to a word line (WL), a bit line (BL), and a bit line bar (BLB). Each row of SRAM cells in the SRAM array is coupled to a common word line and each column of SRAM cells are coupled to a common bit line and a common bit line bar. As such, each of the SRAM cells in the SRAM array may be addressed by selecting a respective word line and a respective pair of bit lines. In embodiments represented in FIGS. 7-12, the SRAM array is coupled to the word line driver via the word lines from rows of SRAM cells and is coupled to the read/write block via bit lines and bit line bars from columns of SRAM cells. In the depicted embodiments, the word line driver is disposed along one side of the SRAM array and the read/write block is disposed along a bottom side of the SRAM array. The word line driver and the read/write block are coupled to and controlled by the memory controller.

Figure 7:
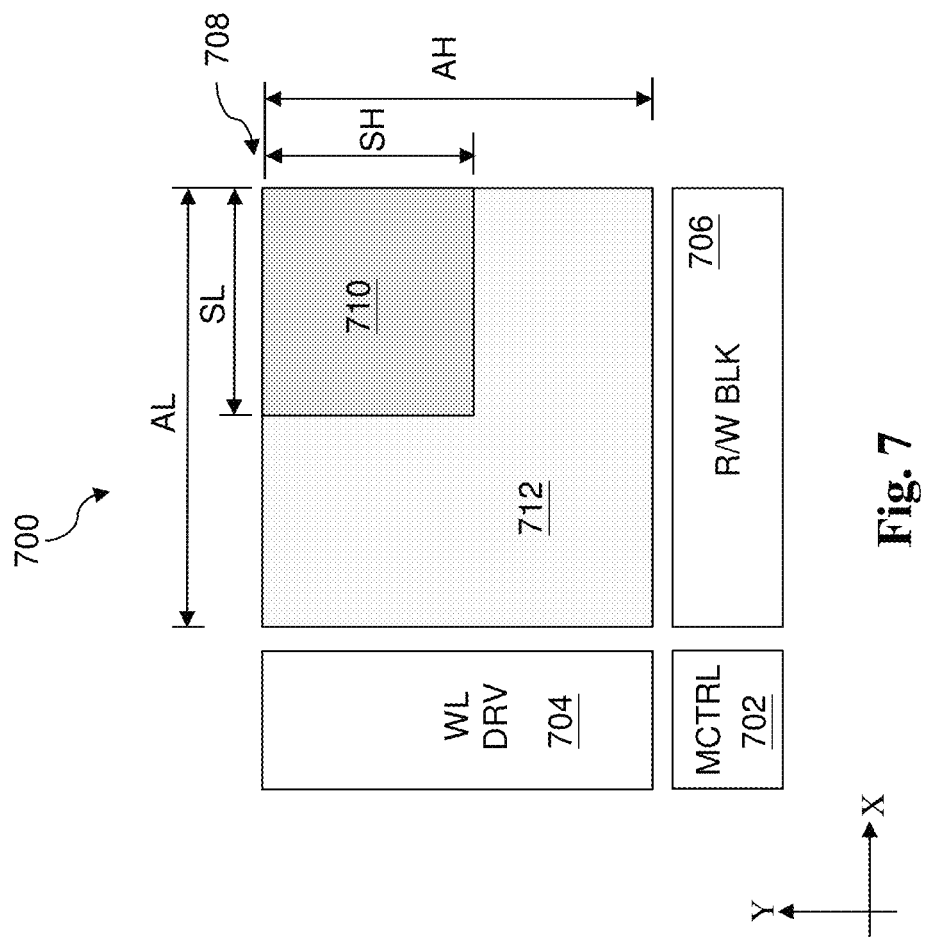
FIGS. 7-12 illustrate embodiments of memory devices, according to one or more aspects of the present disclosure.

Reference is now made to FIG. 7, which illustrates the first memory device 700. The first memory device 700 includes a first SRAM array 708, a first word line driver 704, a first read/write block 706, and a first memory controller 702. Word lines from the first SRAM array 708 are coupled to and addressed by the first word line driver 704. Bit lines and bit line bars from the first SRAM array 708 are coupled to and addressed by the first read/write block 706. The first SRAM array 708 includes a first corner subarray 710 disposed at a corner of the first SRAM array 708 and a first L-shaped subarray 712 that surrounds the first corner subarray 710. In some embodiments, the first corner subarray 710 are formed high-speed SRAM cells such as high-speed FinFET SRAM cells 500-1 shown in FIG. 5A or high-speed MBC SRAM cells 600-1 shown in FIG. 6A and the first L-shaped subarray 712 are formed of low-leakage FinFET SRAM cells 500-3 shown in FIG. 5C or low-leakage MBC SRAM cells 600-3 shown in FIG. 6C. The first memory controller 702, the first word line driver 704 and the first read/write block 706 are formed of the standard n-type FinFETs 100-2N shown in FIG. 1B, standard p-type FinFETs 100-2P shown in FIG. 1E, standard n-type MBC transistors 200-2N shown in FIG. 2B, or standard p-type MBC transistors 200-2P shown in FIG. 2E. To reduce process complexity, all transistors in the first memory device 700 are either all FinFETs or all MBC transistors.

An SRAM array, such as the first SRAM array 708, may come in various memory sizes, such as 128K, 256K, 512K, or even larger sizes. As a rule of thumb, SRAM arrays having more SRAM cells provides lead to smaller device dimension as they can reduce peripheral circuitry (such as word line drivers, memory controllers, and read/write blocks). However, resistive voltage drops limit the dimensions of SRAM arrays. When an SRAM array includes more SRAM cells and becomes more integrated, dimensions of the conductive wires reduce and dimensional reduction of conductive wires lead to increased resistance in word lines and bit lines. Referring to FIG. 7, the first SRAM array 708 has an array length (AL) along the X direction and an array height (AH) along the Y direction. Each of the word lines originating from the first word line driver 704 extends about the array length (AL) to address each row of the first SRAM array 708 and each of the bit lines from the first read/write block 706 extends about the array height (AH) to address each column of the first SRAM array 708. For example, when the first SRAM array 708 is a 128K SRAM array, the first SRAM array 708 may include 512 SRAM cells in each row (along the X direction) and 256 SRAM cells in each column (along the Y direction). In this example, the array length (AL) may be between about 150 µm and about 200 µm and the array height (AH) may be about 30 µm and about 50 µm. As the word lines and bit lines traverse across the first SRAM array 700 from the first word line driver 704 and the first read/write block 706, voltage available to turn on the SRAM cells continue to drop due to line resistance. By implementing high-speed SRAMs (such as high-speed FinFET SRAM cells 500-1 shown in FIG. 5A or high-speed MBC SRAM cells 600-1 shown in FIG. 6A) in the first corner subarray 710, the relatively low threshold voltage of the high-speed SRAMs help compensate for resistive voltage drop due to distance from the first word line driver 704 as well as the first read/write block 706. The first corner subarray 710 may include a subarray length (SL) along the X direction and a subarray height (SH) along the Y direction. In embodiments where the first SRAM array 708 is adopted and the array length (AL) is greater than array height (AH), the subarray length (SL) is between about 12.5% and about 25% of the array length (AL) and the subarray height (SH) is between about 5% and about 10% of the array height (AH) to compensate for voltage drops along both the word lines and the bit lines. When the first corner subarray 710 is too small, it may not serve to assist all SRAM cells that are impacted by the resistive voltage drop. When the first corner subarray 710 is too large, the reduced threshold voltage is not counteracted by the voltage drop and the performance of the first memory device 700 may become imbalanced. In some embodiments, the first memory device 700 is suitable for low-leakage applications as the first L-shaped subarray 712 accounts for the majority of the first SRAM array 708. The first corner subarray 710 includes SRAM cells that are farther away from both the first word line driver 704 along the X direction and the first read/write block 706 along the Y direction.

Figure 8:
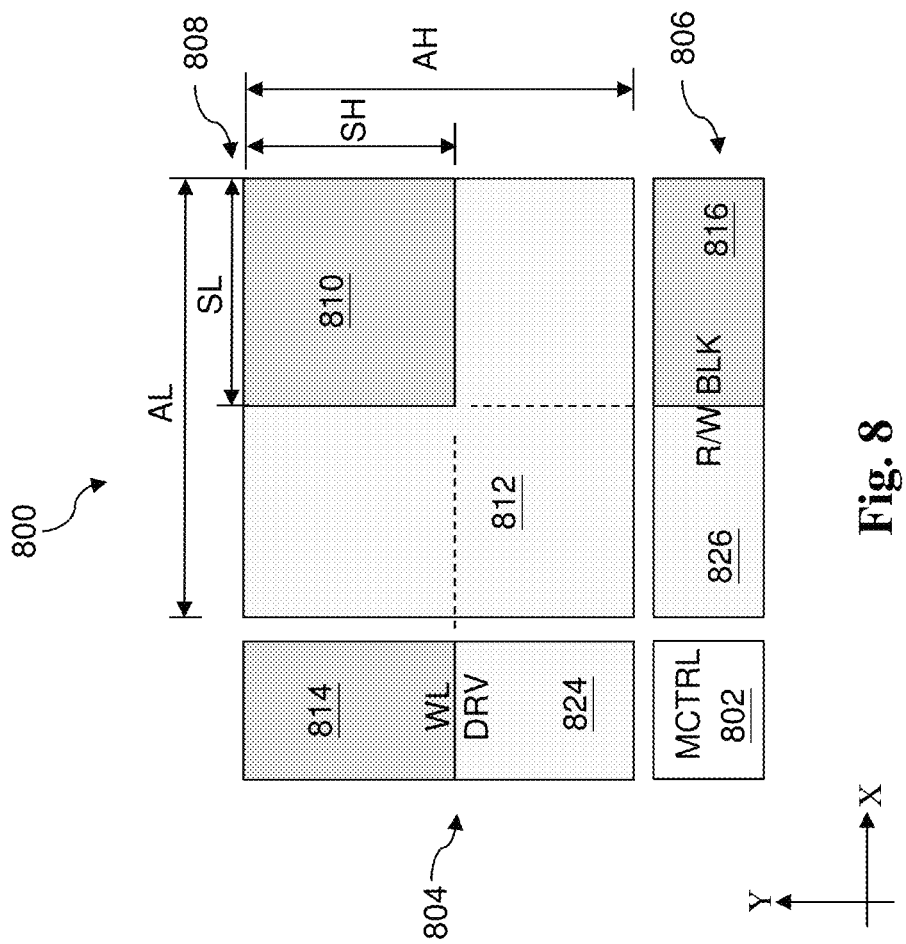

Reference is made to FIG. 8, which illustrates the second memory device 800. The second memory device 800 includes a second SRAM array 808, a second word line driver 804, a second read/write block 806, and a second memory controller 802. Word lines from the second SRAM array 808 are coupled to and addressed by the second word line driver 804. Bit lines and bit line bars from the second SRAM array 808 are coupled to and addressed by the second read/write block 806. The second SRAM array 808 includes a second corner subarray 810 disposed at a corner of the second SRAM array 808 and a second L-shaped subarray 812 that surrounds the second corner subarray 810. In some embodiments, the second corner subarray 810 are of formed high-speed SRAM cells such as high-speed FinFET SRAM cells 500-1 shown in FIG. 5A or high-speed MBC SRAM cells 600-1 shown in FIG. 6A and the second L-shaped subarray 812 are formed of low-leakage FinFET SRAM cells 500-3 shown in FIG. 5C or low-leakage MBC SRAM cells 600-3 shown in FIG. 6C. The second word line driver 804 includes a high-speed region 814 and a low-leakage region 824. The second read/write block 806 includes a high-speed block 816 and a low-leakage block 826. The high-speed region 814 and the high-speed block 816 include the high-speed n-type FinFETs 100-1N shown in FIG. 1A, high-speed p-type FinFETs 100-1P shown in FIG. 1D, high-speed n-type MBC transistors 200-1N shown in FIG. 2A, or high-speed p-type MBC transistors 200-1P shown in FIG. 2D. The low-leakage region 824 and the low-leakage block 826 include the low-leakage n-type FinFETs 100-3N shown in FIG. 1C, low-leakage p-type FinFETs 100-3P shown in FIG. 1F, low-leakage n-type MBC transistors 200-3N shown in FIG. 2C, or low-leakage p-type MBC transistors 200-3P shown in FIG. 2F. The second memory controller 802 is formed of the standard n-type FinFETs 100-2N shown in FIG. 1B, standard p-type FinFETs 100-2P shown in FIG. 1E, standard n-type MBC transistors 200-2N shown in FIG. 2B, or standard p-type MBC transistors 200-2P shown in FIG. 2E. The second corner subarray 810 is addressed by the high-speed region 814 and the high-speed block 816 while the second L-shaped subarray 812 is addressed by the low-leakage region 824 and the low-leakage block 826. To reduce process complexity, all transistors in the second memory device 800 are either all FinFETs or all MBC transistors.

In some embodiments, the second memory device 800 is suitable for low-leakage applications as the second L-shaped subarray 812 accounts for the majority of the second SRAM array 808. Similar to the first corner subarray 710 in FIG. 7, the second corner subarray 810 includes SRAM cells that are farther away from both the second word line driver 804 along the X direction and the second read/write block 806 along the Y direction. As shown in FIG. 8, the second SRAM array 808 includes an array length (AL) along the X direction and an array height (AH) along the Y direction and the second corner subarray 810 may include a subarray length (SL) along the X direction and a subarray height (SH) along the Y direction. In some embodiments where second SRAM array 808 is adopted and the array length (AL) is greater than array height (AH), the subarray length (SL) is between about 12.5% and about 25% of the array length (AL) and the subarray height (SH) is between about 5% and about 10% of the array height (AH) to compensate for voltage drops along both the word lines and the bit lines. The relatively low threshold voltage of the high-speed SRAMs in the second corner subarray 810 help compensate for resistive voltage drop due to distance from the second word line driver 804 as well as the second read/write block 806. The increased drive currents provided by the high-speed region 814 and the high-speed block 816 also help compensate for the resistive voltage drop due to distance.

Figure 9:
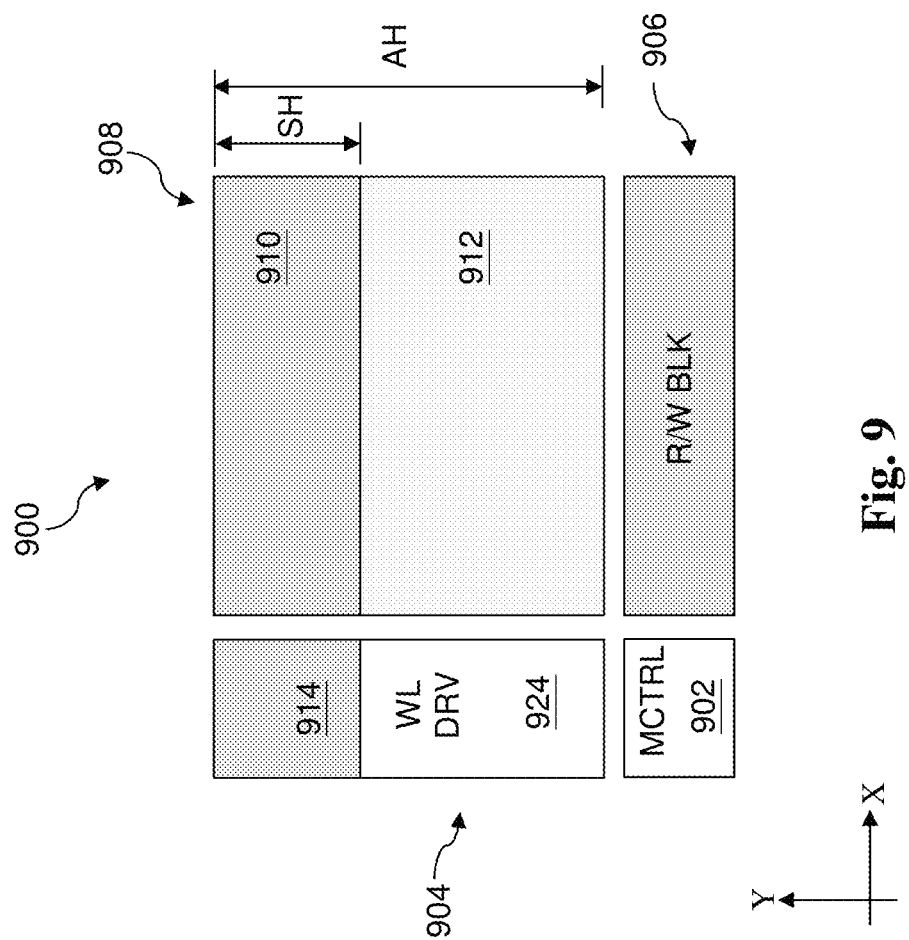

Reference is made to FIG. 9, which illustrates the third memory device 900. The third memory device 900 includes a third SRAM array 908, a third word line driver 904, a third read/write block 906, and a third memory controller 902. Word lines from the third SRAM array 908 are coupled to and addressed by the third word line driver 904. Bit lines and bit line bars from the third SRAM array 908 are coupled to and addressed by the third read/write block 906. The third SRAM array 908 includes a first stripe subarray 910 and a second stripe subarray 912, which extends lengthwise parallel to one another along the X direction. Each of the first stripe subarray 910 and the second stripe subarray 912 extends the entire width of the third SRAM array 908 along the X direction. In some embodiments, the first stripe subarray 910 is formed of high-speed SRAM cells such as high-speed FinFET SRAM cells 500-1 shown in FIG. 5A or high-speed MBC SRAM cells 600-1 shown in FIG. 6A and the second stripe subarray 912 is formed of low-leakage FinFET SRAM cells 500-3 shown in FIG. 5C or low-leakage MBC SRAM cells 600-3 shown in FIG. 6C. The third word line driver 904 of the third memory device 900 includes a high-speed region 914 and a standard region 924. The high-speed region 914 and the third read/write block 906 include the high-speed n-type FinFETs 100-1N shown in FIG. 1A, high-speed p-type FinFETs 100-1P shown in FIG. 1D, high-speed n-type MBC transistors 200-1N shown in FIG. 2A, or high-speed p-type MBC transistors 200-1P shown in FIG. 2D. The third memory controller 902 and the standard region 924 are formed of the standard n-type FinFETs 100-2N shown in FIG. 1B, standard p-type FinFETs 100-2P shown in FIG. 1E, standard n-type MBC transistors 200-2N shown in FIG. 2B, or standard p-type MBC transistors 200-2P shown in FIG. 2E. The first stripe subarray 910 is addressed by the high-speed region 914 and the third read/write block 906 while the second stripe subarray 912 is addressed by the standard region 924 and the third read/write block 906. To reduce process complexity, all transistors in the third memory device 900 are either all FinFETs or all MBC transistors.

In some embodiments, the third memory device 900 is suitable for low-leakage applications because the second stripe subarray 912 is larger than the first stripe subarray 910. The first stripe subarray 910 includes SRAM cells that are farther away from the third read/write block 906 along the Y direction. The relatively low threshold voltage of the high-speed SRAMs in the first stripe subarray 910 help compensate for resistive voltage drop due to distance from the third read/write block 906. As shown in FIG. 9, the third SRAM array 908 includes an array height (AH) along the Y direction and the first stripe subarray 910 may include a subarray height (SH) along the Y direction. In some embodiments where third SRAM array 908 is adopted, the subarray height (SH) is between about 5% and about 10% of the array height (AH) to compensate for voltage drops along the bit lines. The increased drive currents provided by the high-speed region 914 also helps compensate for the resistive voltage drop due to distance.

Figure 10:
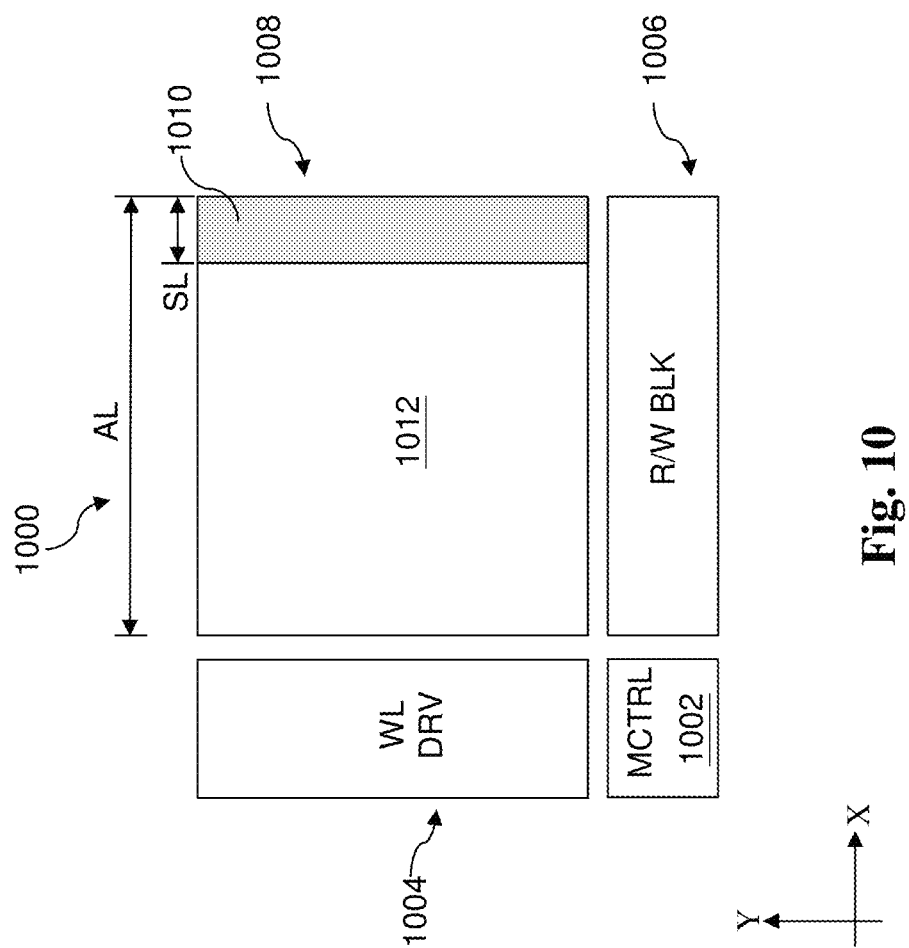

Reference is made to FIG. 10, which illustrates the fourth memory device 1000. The fourth memory device 1000 includes a fourth SRAM array 1008, a fourth word line driver 1004, a fourth read/write block 1006, and a fourth memory controller 1002. Word lines from the fourth SRAM array 1008 are coupled to and addressed by the fourth word line driver 1004. Bit lines and bit line bars from the fourth SRAM array 1008 are coupled to and addressed by the fourth read/write block 1006. The fourth SRAM array 1008 includes a third stripe subarray 1010 and a fourth stripe subarray 1012, which extend lengthwise parallel to one another along the Y direction. Each of the third stripe subarray 1010 and the fourth stripe subarray 1012 extends the entire length of the fourth SRAM array 1008 along the Y direction. In some embodiments, the third stripe subarray 1010 is formed of high-speed SRAM cells such as high-speed FinFET SRAM cells 500-1 shown in FIG. 5A or high-speed MBC SRAM cells 600-1 shown in FIG. 6A and the second stripe subarray 912 is formed of low-leakage FinFET SRAM cells 500-3 shown in FIG. 5C or low-leakage MBC SRAM cells 600-3 shown in FIG. 6C. The fourth word line driver 1004, the fourth memory controller 1002, the fourth stripe subarray 1012, and the fourth read/write block 1006 are formed of the standard n-type FinFETs 100-2N shown in FIG. 1B, standard p-type FinFETs 100-2P shown in FIG. 1E, standard n-type MBC transistors 200-2N shown in FIG. 2B, or standard p-type MBC transistors 200-2P shown in FIG. 2E. To reduce process complexity, all transistors in the fourth memory device 1000 are either all FinFETs or all MBC transistors.

In some embodiments, the fourth memory device 1000 is suitable for standard threshold voltage applications because the fourth stripe subarray 1012 accounts for the majority of the fourth SRAM array 1008. The third stripe subarray 1010 includes SRAM cells that are farther away from the fourth word line driver 1004 along the X direction. The relatively low threshold voltage of the high-speed SRAMs in the third stripe subarray 1010 help compensate for resistive voltage drop due to distance from the fourth word line driver 1004.

As shown in FIG. 10, the fourth SRAM array 1008 includes an array length (AL) along the X direction and the third stripe subarray 1010 may include a subarray length (SL) along the X direction. In some embodiments where the fourth SRAM array 1008 is adopted, the subarray length (SL) is between about 12.5% and about 25% of the array length (AL) to compensate for voltage drops along the word lines.

Figure 11:
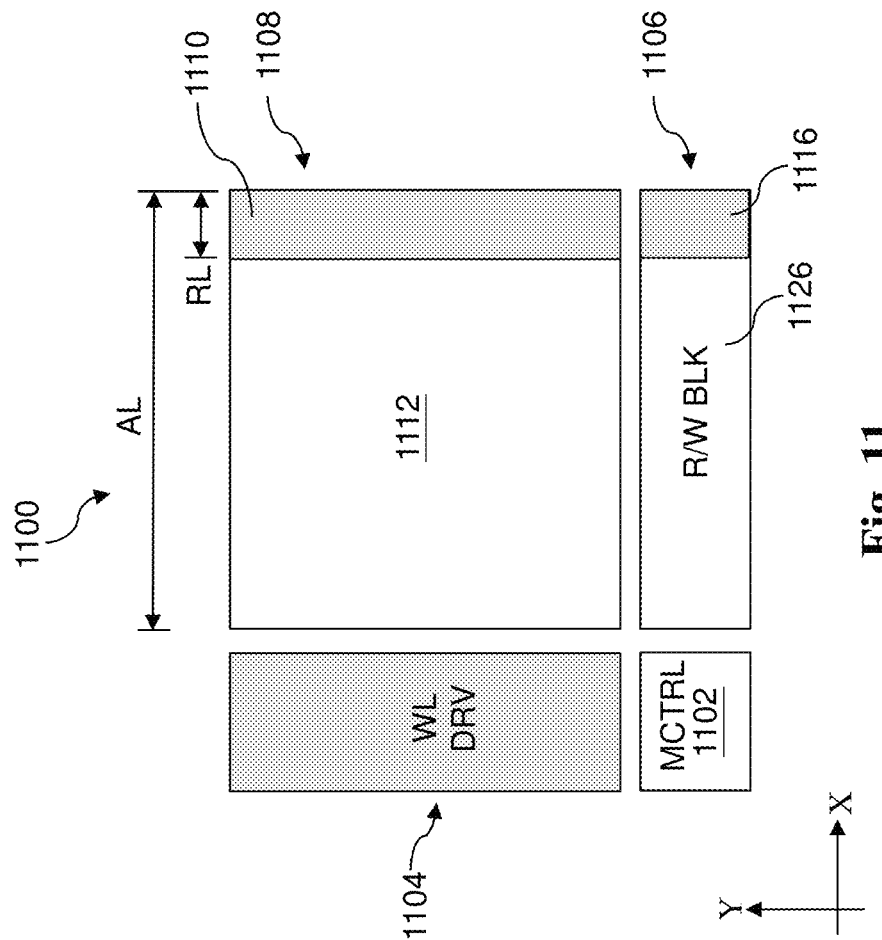

Reference is made to FIG. 11, which illustrates the fifth memory device 1100. The fifth memory device 1100 includes a fifth SRAM array 1108, a fifth word line driver 1104, a fifth read/write block 1106, and a fifth memory controller 1102. Word lines from the fifth SRAM array 1108 are coupled to and addressed by the fifth word line driver 1104. Bit lines and bit line bars from the fifth SRAM array 1108 are coupled to and addressed by the fifth read/write block 1106. The fifth SRAM array 1108 includes a fifth stripe subarray 1110 and a sixth stripe subarray 1112, which extend lengthwise parallel to one another along the Y direction. Each of the fifth stripe subarray 1110 and the sixth stripe subarray 1112 extends the entire length of the fifth SRAM array 1108 along the Y direction. In some embodiments, the fifth stripe subarray 1110 is formed of high-speed SRAM cells such as high-speed FinFET SRAM cells 500-1 shown in FIG. 5A or high-speed MBC SRAM cells 600-1 shown in FIG. 6A and the sixth stripe subarray 1112 is formed of standard FinFET SRAM cells 500-2 shown in FIG. 5B or standard MBC SRAM cells 600-2 shown in FIG. 6B. The fifth read/write block 1106 includes a high-speed block 1116 and a standard block 1126. The high-speed block 1116 and the fifth word line driver 1104 include the high-speed n-type FinFETs 100-1N shown in FIG. 1A, high-speed p-type FinFETs 100-1P shown in FIG. 1D, high-speed n-type MBC transistors 200-1N shown in FIG. 2A, or high-speed p-type MBC transistors 200-1P shown in FIG. 2D. The standard block 1126 and the fifth memory controller 1102 are formed of the standard n-type FinFETs 100-2N shown in FIG. 1B, standard p-type FinFETs 100-2P shown in FIG. 1E, standard n-type MBC transistors 200-2N shown in FIG. 2B, or standard p-type MBC transistors 200-2P shown in FIG. 2E. To reduce process complexity, all transistors in the fifth memory device 1100 are either all FinFETs or all MBC transistors.

In some embodiments, the fifth memory device 1100 is suitable for standard threshold voltage applications because the sixth stripe subarray 1112 accounts for the majority of the fifth SRAM array 1108. The fifth stripe subarray 1110 includes SRAM cells that are farther away from the fifth word line driver 1104 along the X direction. The relatively low threshold voltage of the high-speed SRAMs in the fifth stripe subarray 1110 help compensate for resistive voltage drop due to distance from the fifth word line driver 1104. As shown in FIG. 11, the fifth SRAM array 1108 includes an array length (AL) along the X direction and the fifth stripe subarray 1110 may include a subarray length (SL) along the X direction. In some embodiments where the fifth SRAM array 1108 is adopted, the subarray length (SL) is between about 12.5% and about 25% of the array length (AL) to compensate for voltage drops along the word lines.

Figure 12:
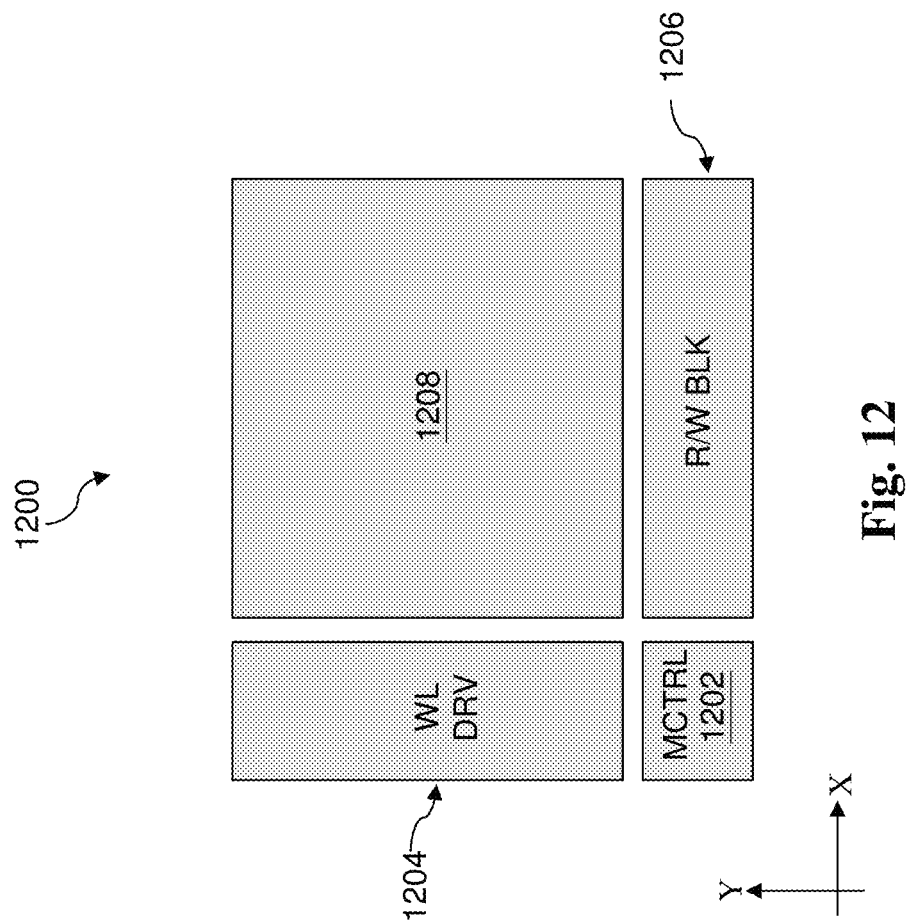

Reference is made to FIG. 12, which illustrates the sixth memory device 1200. The sixth memory device 1200 includes a sixth SRAM array 1208, a sixth word line driver 1204, a sixth read/write block 1206, and a sixth memory controller 1202. Word lines from the sixth SRAM array 1208 are coupled to and addressed by the sixth word line driver 1204. Bit lines and bit line bars from the sixth SRAM array 1208 are coupled to and addressed by the sixth read/write block 1206. The sixth SRAM array 1208 is formed of high-speed SRAM cells such as high-speed FinFET SRAM cells 500-1 shown in FIG. 5A or high-speed MBC SRAM cells 600-1 shown in FIG. 6A. The sixth word line driver 1204, the sixth read/write block 1206 and the sixth memory controller 1202 include the high-speed n-type FinFETs 100-1N shown in FIG. 1A, high-speed p-type FinFETs 100-1P shown in FIG. 1D, high-speed n-type MBC transistors 200-1N shown in FIG. 2A, or high-speed p-type MBC transistors 200-1P shown in FIG. 2D. To reduce process complexity, all transistors in the sixth memory device 1200 are either all FinFETs or all MBC transistors. In some embodiments, the sixth memory device 1200 is suitable for high-speed applications because the sixth SRAM array 1208 is formed of high-speed SRAM cells.

Figure 13:
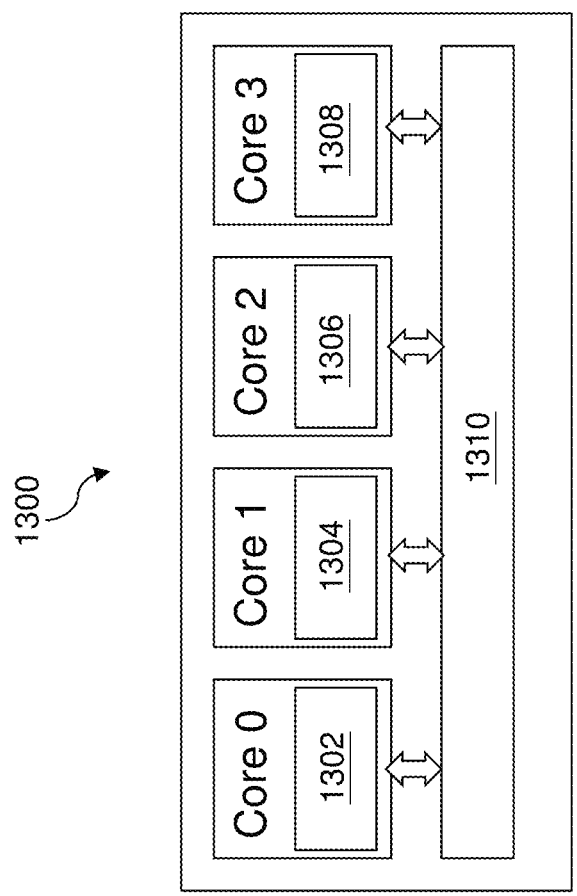
FIG. 13 an integrated circuit (IC) device that includes a memory device in FIGS. 7-12, according to one or more aspects of the present disclosure.

The various embodiments of memory devices shown in FIGS. 7-12 may be used in a central processing unit (CPU) 1300 illustrated in FIG. 13. In the depicted embodiments, the CPU 1300 is a multi-core CPU and includes a Core 0, a Core 1, a Core 2, and Core 3. Each of the cores includes a deposited memory device. As shown in FIG. 13, Core 0 includes a first cache memory 1302, Core 1 includes a second cache memory 1304, Core 2 includes a third cache memory 1306, and Core 3 includes a fourth cache memory 1308. In some embodiments, the first cache memory 1302 is for high-speed applications and may be implemented using the sixth memory device 1200. The second cache memory 1304 and the third cache memory 1306 are for standard threshold voltage applications and may be implemented using either the fourth memory device 1000 or the fifth memory device 1100. The fourth cache memory 1308 is for low-leakage application and may be implemented using the first memory device 700, the second memory device 800, or the third memory device 900. As shown in FIG. 13, Core 0, Core 1, Core 2, and Core 3 of the CPU 1300 are coupled to a shared memory device 1310. In some embodiments, the shared memory device 1310 may be implemented with the first memory device 700 (FIG. 7), the second memory device 800 (FIG. 8), or the third memory device 900 (FIG. 9).

Embodiments of the present disclosure provide benefits. For example, different work function stacks may be applied to similar transistor structures to achieve different threshold voltages for different applications, such as high-speed applications, low-leakage applications, or standard threshold applications. As used herein, transistor structures are similar when they are all FinFETs or all MBC transistors having similar dimensions (such as similar fin heights, fin widths, channel member thicknesses, or channel member widths). The different work function stacks of the present disclosure may also be applied to transistors in word line drivers, memory controllers, read/write blocks, and SRAM arrays to achieve different SRAM memory devices that balance different speed and low-leakage requirements.

The present disclosure provides for many different embodiments. In one embodiment, an SRAM array is provided. The SRAM array includes a first subarray including a plurality of first SRAM cells, and a second subarray including a plurality of second SRAM cells. Each n-type transistor in the plurality of first SRAM cells includes a first work function stack and each n-type transistor in the plurality of second SRAM cells includes a second work function stack different from the first work function stack.

In some embodiments, a threshold voltage of each n-type transistor in the plurality of first SRAM cells is smaller than a threshold voltage of each n-type transistor in the plurality of second SRAM cells. In some implementations, each p-type transistor in the plurality of first SRAM cells includes the second work function stack and each p-type transistor in the plurality of second SRAM cells includes the first work function stack. In some embodiments, a threshold voltage of each p-type transistor in the plurality of first SRAM cells is greater than a threshold voltage of each p-type transistor in the plurality of second SRAM cells. In some instances, the first work function stack includes a titanium aluminum layer and the second work function stack includes at least one titanium nitride layer and the titanium aluminum layer disposed over the at least one titanium nitride layer. In some embodiments, the first subarray is disposed at a corner of the SRAM array and the second subarray surrounds the first subarray. In some embodiments, the SRAM array includes a plurality of word lines extending along a first direction and a plurality of bit lines extending along a second direction perpendicular to the first direction. The SRAM array has a length along the first direction and a width along the second direction. In some embodiments, the first subarray is parallel to the second subarray, and both the first subarray and the second subarray extend an entirety of the length of the SRAM array. In some implementations, the first subarray is parallel to the second subarray, and both the first subarray and the second subarray extend an entirety of the width of the SRAM array.

In another embodiment, a memory device is provided. The memory device includes a Static Random Access Memory (SRAM) array that includes a first subarray including a plurality of first SRAM cells, and a second subarray including a plurality of second SRAM cells. Each n-type transistor in the plurality of first SRAM cells includes a first work function stack, each n-type transistor in the plurality of second SRAM cells includes a second work function stack different from the first work function stack, each p-type transistor in the plurality of first SRAM cells includes the second work function stack, each p-type transistor in the plurality of second SRAM cells includes the first work function stack, and a thickness of the second work function stack is greater than a thickness of the first work function stack.

In some embodiments, the first work function stack includes a titanium aluminum layer and the second work function stack includes at least one titanium nitride layer and the titanium aluminum layer disposed over the at least one titanium nitride layer. In some embodiments, the memory device may further include a word line driver coupled to the plurality of first SRAM cells and the plurality of second SRAM cells via a plurality of word lines extending along a first direction; and a read/write block coupled to the plurality of first SRAM cells and the plurality of second SRAM cells via a plurality of bit lines extending along a second direction perpendicular to the first direction. Each n-type transistor in the word line driver and the read/write block includes a third work function stack different from the first work function stack or the second work function stack. In some embodiments, the third work function stack is thinner than the second work function stack and thicker than the first work function stack. In some implementations, the memory device may further include a word line driver coupled to the plurality of first SRAM cells and the plurality of second SRAM cells via a plurality of word lines. The word line driver includes a high-speed region and a standard region, each n-type transistor in the high-speed region includes the first work function stack, and each n-type transistor in the standard region includes a third work function stack different from the first work function stack or the second work function stack.

In some implementations, the memory device may further include a read/write block coupled to the plurality of first SRAM cells and the plurality of second SRAM cells via a plurality of bit lines. The read/write block includes a high-speed block and a standard block and each n-type transistor in the high-speed block includes the first work function stack. Each n-type transistor in the standard block includes a third work function stack different from the first work function stack or the second work function stack.

In still another embodiment, a memory device is provided. The memory device includes a Static Random Access Memory (SRAM) array that includes a first subarray including a plurality of first SRAM cells, and a second subarray including a plurality of second SRAM cells, a word line driver coupled to the plurality of first SRAM cells and the plurality of second SRAM cells via a plurality of word lines extending along a first direction, and a read/write block coupled to the plurality of first SRAM cells and the plurality of second SRAM cells via a plurality of bit lines extending along a second direction perpendicular to the first direction. Each n-type transistor in the plurality of first SRAM cells includes a first work function stack, each n-type transistor in the plurality of second SRAM cells includes a second work function stack different from the first work function stack, each p-type transistor in the plurality of first SRAM cells includes the second work function stack, each p-type transistor in the plurality of second SRAM cells includes the first work function stack, the first work function stack includes a titanium aluminum layer, the second work function stack includes at least one titanium nitride layer and the titanium aluminum layer disposed over the at least one titanium nitride layer.

In some embodiments, the word line driver includes a first portion and a second portion, the plurality of word lines include a first plurality of word lines and a second plurality of word lines, the first portion is coupled to the first subarray via the first plurality of word lines, the second portion is coupled to the second subarray via the second plurality of word lines, each n-type transistor in the first portion includes the first work function stack, and each n-type transistor in the second portion includes the second work function stack. In some embodiments, the read/write block includes a first block and a second block, the plurality of bit lines include a first plurality of bit lines and a second plurality of bit lines, the first block is coupled to the first subarray via the first plurality of bit lines, the second block is coupled to the second subarray via the second plurality of bit lines, each n-type transistor in the first block includes the first work function stack, and each n-type transistor in the second block includes a third work function stack different from the first work function stack or the second work function stack. In some instances, the first subarray is disposed farther away from the word line driver than the second subarray. In some instances, the first subarray is disposed farther away from the read/write block than the second subarray.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a memory array comprising:
a first subarray including a plurality of first SRAM cells,
a second subarray including a plurality of second SRAM cells, and
a word line spanning over the first subarray and the second subarray and electrically coupled to at least one of the plurality of first SRAM cells and at least one of the plurality of second SRAM cells; and
a word line driver adjacent the second subarray and away from the first subarray
wherein a threshold voltage of each n-type transistor in the plurality of first SRAM cells is smaller than a threshold voltage of each n-type transistor in the plurality second SRAM cells.

2. The memory device of claim 1,
wherein the memory array has a first length along a direction,
wherein the first subarray has a second length along the direction,
wherein the first length is smaller than the first length.

3. The memory device of claim 1,
wherein each n-type transistor in the plurality of first SRAM cells includes a first work function stack,
wherein each n-type transistor in the plurality of second SRAM cells includes a second work function stack different from the first work function stack.

4. The memory device of claim 3,
wherein each p-type transistor in the plurality of first SRAM cells includes the second work function stack,
wherein each p-type transistor in the plurality of second SRAM cells includes the first work function stack.

5. The memory device of claim 4, wherein a threshold voltage of each p-type transistor in the plurality of first SRAM cells is greater than a threshold voltage of each p-type transistor in the plurality of second SRAM cells.

6. The memory device of claim 4,
wherein the first work function stack includes a titanium aluminum layer
wherein the second work function stack includes at least one titanium nitride layer and the titanium aluminum layer disposed over the at least one titanium nitride layer.

7. The memory device of claim 1, wherein each of the plurality of first SRAM cells and the plurality of second SRAM cells includes:
two p-type transistors disposed over an n-type well;
two n-type transistors disposed over a first p-type well; and
two n-type transistors disposed over a second p-type well,
wherein the n-type well is disposed directly between the first p-type well and the second p-type well.

8. The memory device of claim 1,
wherein the memory array and the first subarray are both rectangular in shape,
wherein the first subarray is disposed at a corner of the memory array,
wherein the second subarray surrounds the first subarray.

9. The memory device of claim 1,
wherein the word line driver comprises a high-speed region and a low-leakage region,
wherein a threshold voltage of each n-type transistor in the high-speed region is smaller than a threshold voltage of each n-type transistor in the low-leakage region.

10. The memory device of claim 9, wherein the second subarray is addressed by the high-speed region.

11. A memory device, comprising:
a Static Random Access Memory (SRAM) array having a length extending along a first direction and a height extending along a second direction perpendicular to the first direction, the SRAM array comprising:
a first subarray including a plurality of first SRAM cells, and
a second subarray including a plurality of second SRAM cells;
a word line driver disposed adjacent to the SRAM array along the first direction and coupled to the plurality of first SRAM cells and the plurality of second SRAM cells via a plurality of word lines extending along the first direction; and
a read/write block adjacent to the SRAM array along the second direction,
wherein the first subarray is spaced apart from the word line driver by at least a portion of the second subarray,
wherein at least one word line of the plurality of word lines is electrically coupled to at least one of the plurality of first SRAM cells and at least one of the plurality of second SRAM cells
wherein a threshold voltage of each n-type transistor in the plurality of first SRAM cells is smaller than a threshold voltage of each n-type transistor in the plurality second SRAM cells.

12. The memory device of claim 11, wherein each of the plurality of first SRAM cells and the plurality of second SRAM cells is electrically coupled to the read/write block by a plurality of bit lines extending along the second direction.

13. The memory device of claim 11, wherein a length of the first subarray along the first direction is smaller than the length of the SRAM array.

14. The memory device of claim 13, wherein a height of the first subarray along the second direction is smaller than the height of the SRAM array.

15. The memory device of claim 11,
wherein each n-type transistor in the plurality of first SRAM cells includes a first work function stack,
wherein each n-type transistor in the plurality of second SRAM cells includes a second work function stack different from the first work function stack,
wherein each p-type transistor in the plurality of first SRAM cells includes the second work function stack,
wherein each p-type transistor in the plurality of second SRAM cells includes the first work function stack.

16. The memory device of claim 15, wherein a thickness of the second work function stack is greater than a thickness of the first work function stack.

17. The memory device of claim 15,
wherein the first work function stack includes a titanium aluminum layer
wherein the second work function stack includes at least one titanium nitride layer and the titanium aluminum layer disposed over the at least one titanium nitride layer.

18. A memory device, comprising:
a Static Random Access Memory (SRAM) array comprising:
a first subarray including a plurality of first SRAM cells, and a second subarray including a plurality of second SRAM cells;
a word line driver coupled to the plurality of first SRAM cells and the plurality of second SRAM cells via a plurality of word lines extending along a first direction; and
a read/write block coupled to the plurality of first SRAM cells and the plurality of second SRAM cells via a plurality of bit lines extending along a second direction perpendicular to the first direction,
wherein each n-type transistor in the plurality of first SRAM cells includes a first work function stack,
wherein each n-type transistor in the plurality of second SRAM cells includes a second work function stack different from the first work function stack,
wherein a word line of the plurality of word lines spans over the first subarray and the second subarray and is electrically coupled to at least one of the plurality of first SRAM cells and at least one of the plurality of second SRAM cells.

19. The memory device of claim 18,
wherein each p-type transistor in the plurality of first SRAM cells includes the second work function stack,
wherein each p-type transistor in the plurality of second SRAM cells includes the first work function stack.

20. The memory device of claim 18,
wherein the first work function stack includes a titanium aluminum layer,
wherein the second work function stack includes at least one titanium nitride layer and the titanium aluminum layer disposed over the at least one titanium nitride layer.

* * * * *